(12) United States Patent
Yoshikawa et al.

(10) Patent No.: US 8,716,818 B2
(45) Date of Patent: May 6, 2014

(54) MAGNETORESISTIVE ELEMENT AND METHOD OF MANUFACTURING THE SAME

(75) Inventors: Masatoshi Yoshikawa, Yokohama (JP); Satoshi Seto, Kamakura (JP); Hideaki Harakawa, Yokohama (JP); Jyunichi Ozeki, Yokosuka (JP); Tatsuya Kishi, Yokohama (JP); Keiji Hosotani, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/428,465

(22) Filed: Mar. 23, 2012

(65) Prior Publication Data

US 2013/0001652 A1 Jan. 3, 2013

(30) Foreign Application Priority Data

Jul. 1, 2011 (JP) .................................. 2011-147464

(51) Int. Cl.
*H01L 29/82* (2006.01)
*G11C 11/02* (2006.01)

(52) U.S. Cl.
USPC .... 257/421; 257/422; 257/427; 257/E29.323; 438/3

(58) Field of Classification Search
USPC ....................... 257/421–427; 438/3
See application file for complete search history.

(56) References Cited

U.S. PATENT DOCUMENTS 6,781,173 B2 * 8/2004 Tuttle et al. .................... 257/295
2010/0097846 A1 * 4/2010 Sugiura et al. ................ 365/158

FOREIGN PATENT DOCUMENTS

JP 2009-266861 11/2009

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

According to one embodiment, a magnetoresistive element includes a storage layer having a variable and perpendicular magnetization, a tunnel barrier layer on the storage layer, a reference layer having an invariable and perpendicular magnetization on the tunnel barrier layer, a hard mask layer on the reference layer, and a sidewall spacer layer on sidewalls of the reference layer and the hard mask layer. An in-plane size of the reference layer is smaller than an in-plane size of the storage layer. A difference between the in-plane sizes of the storage layer and the reference layer is 2 nm or less. The sidewall spacer layer includes a material selected from a group of a diamond, DLC, BN, SiC, $B_4C$, $Al_2O_3$ and AlN.

20 Claims, 19 Drawing Sheets

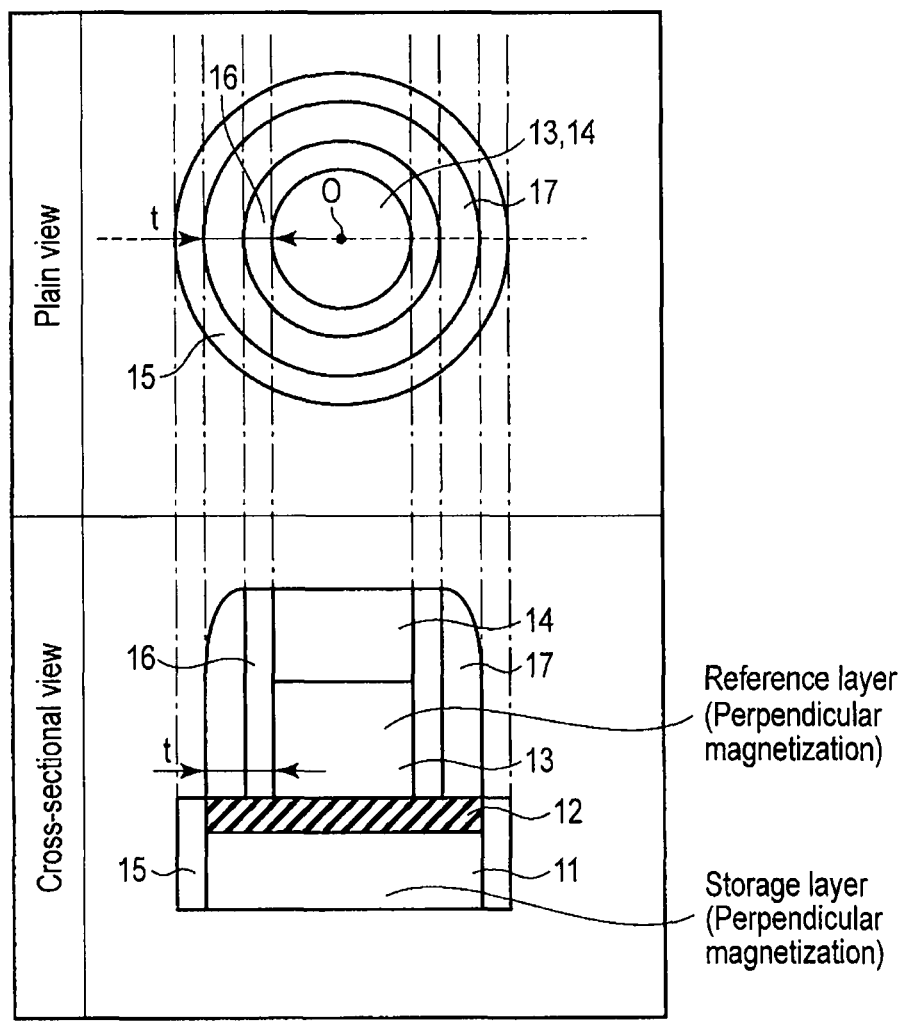
F I G. 1

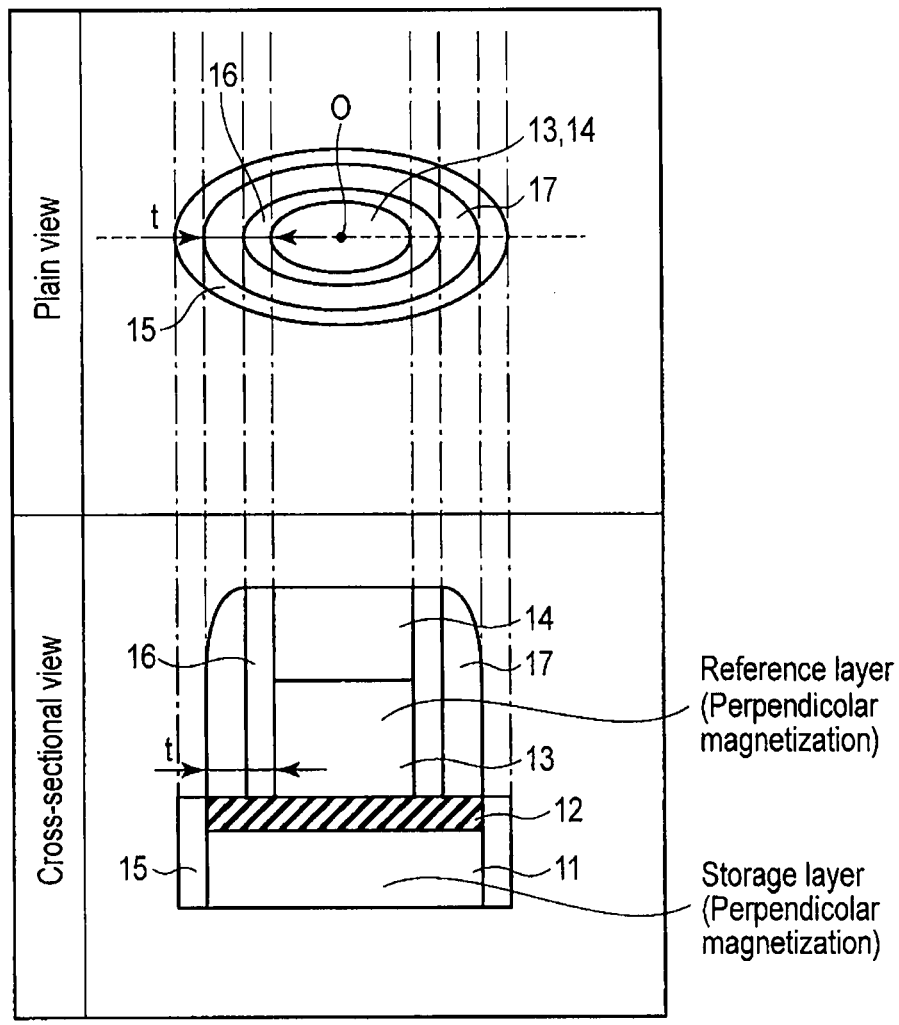
F I G. 2

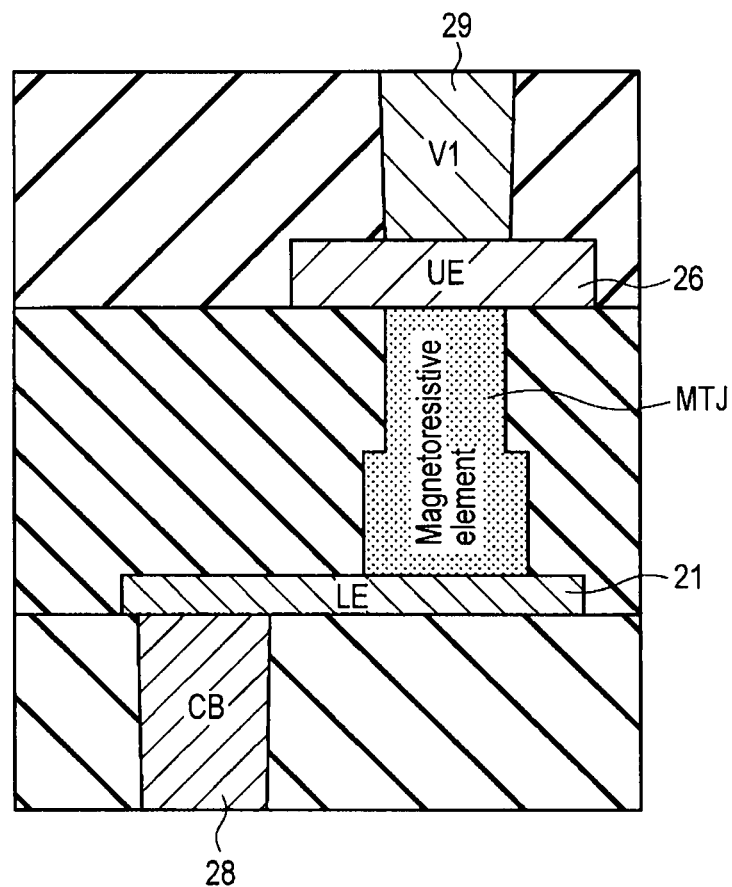
F I G. 9

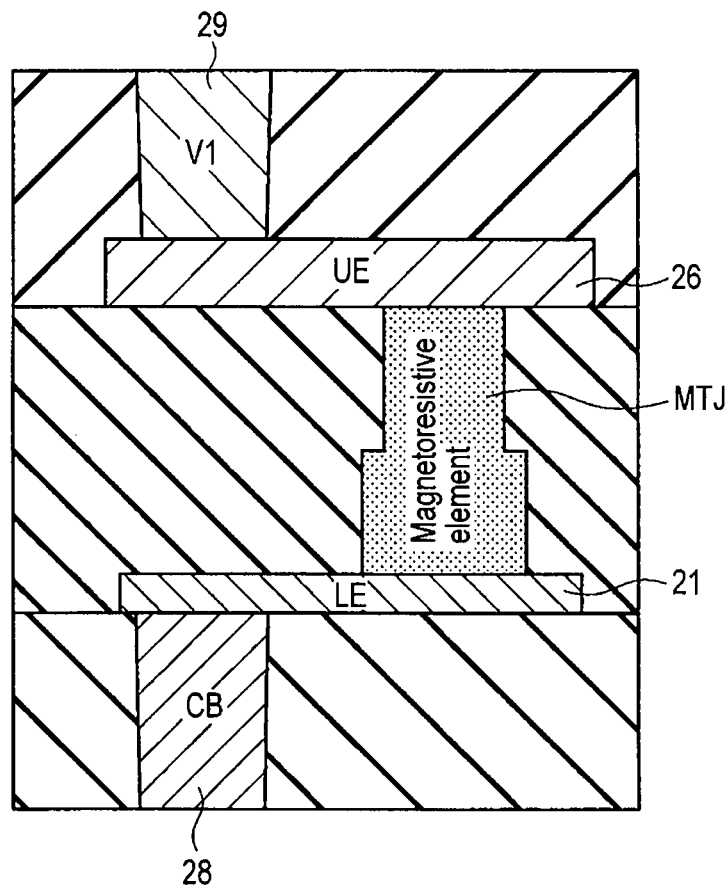
F I G. 10

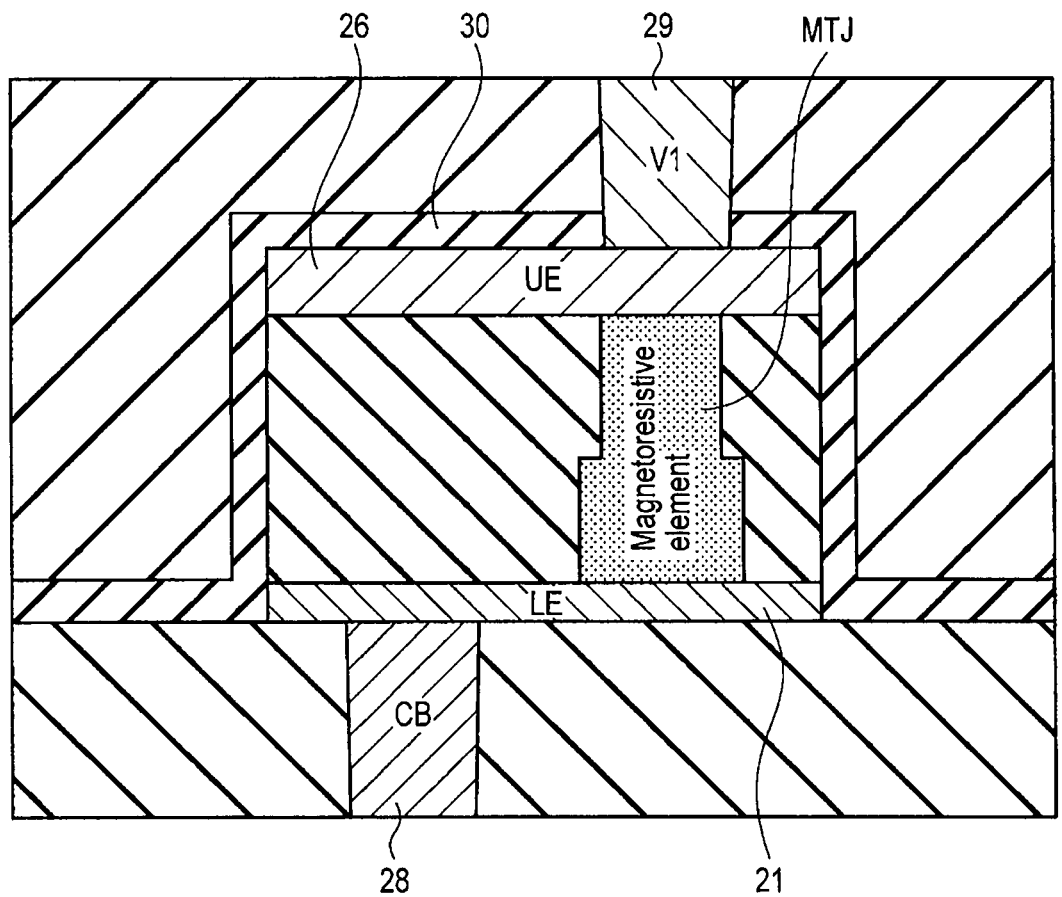
F I G. 11

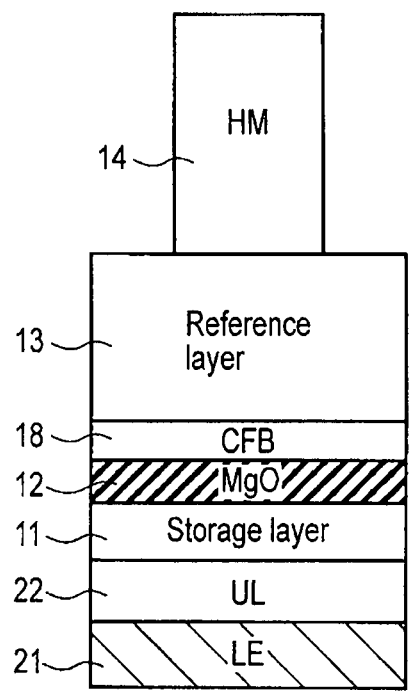
F I G. 1 2
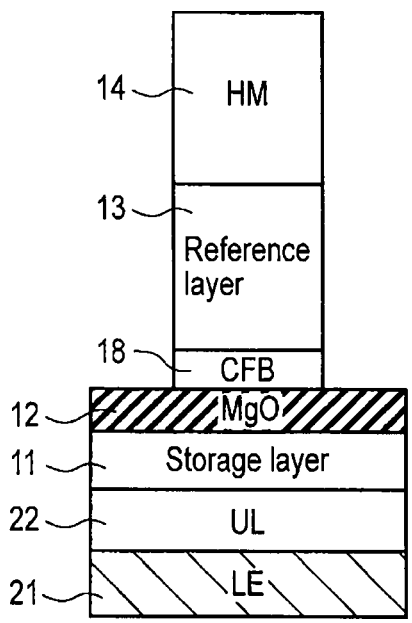
F I G. 1 3

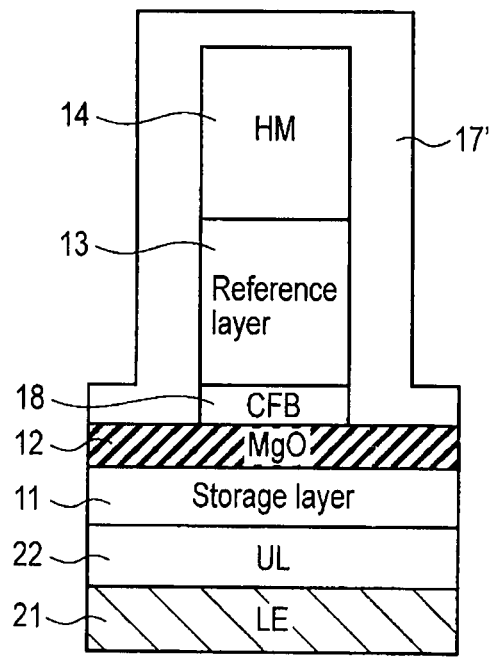
F I G. 14
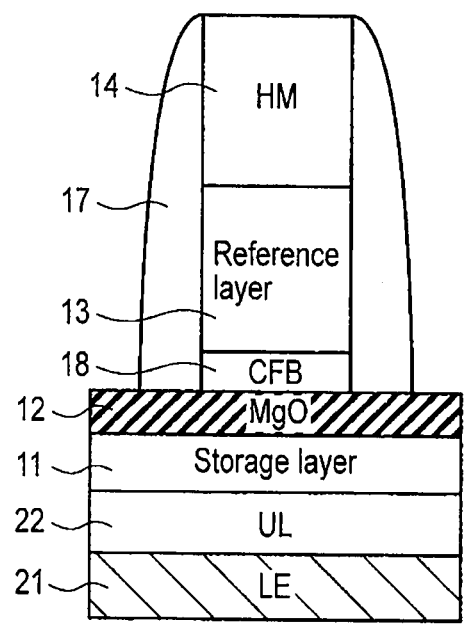
F I G. 15

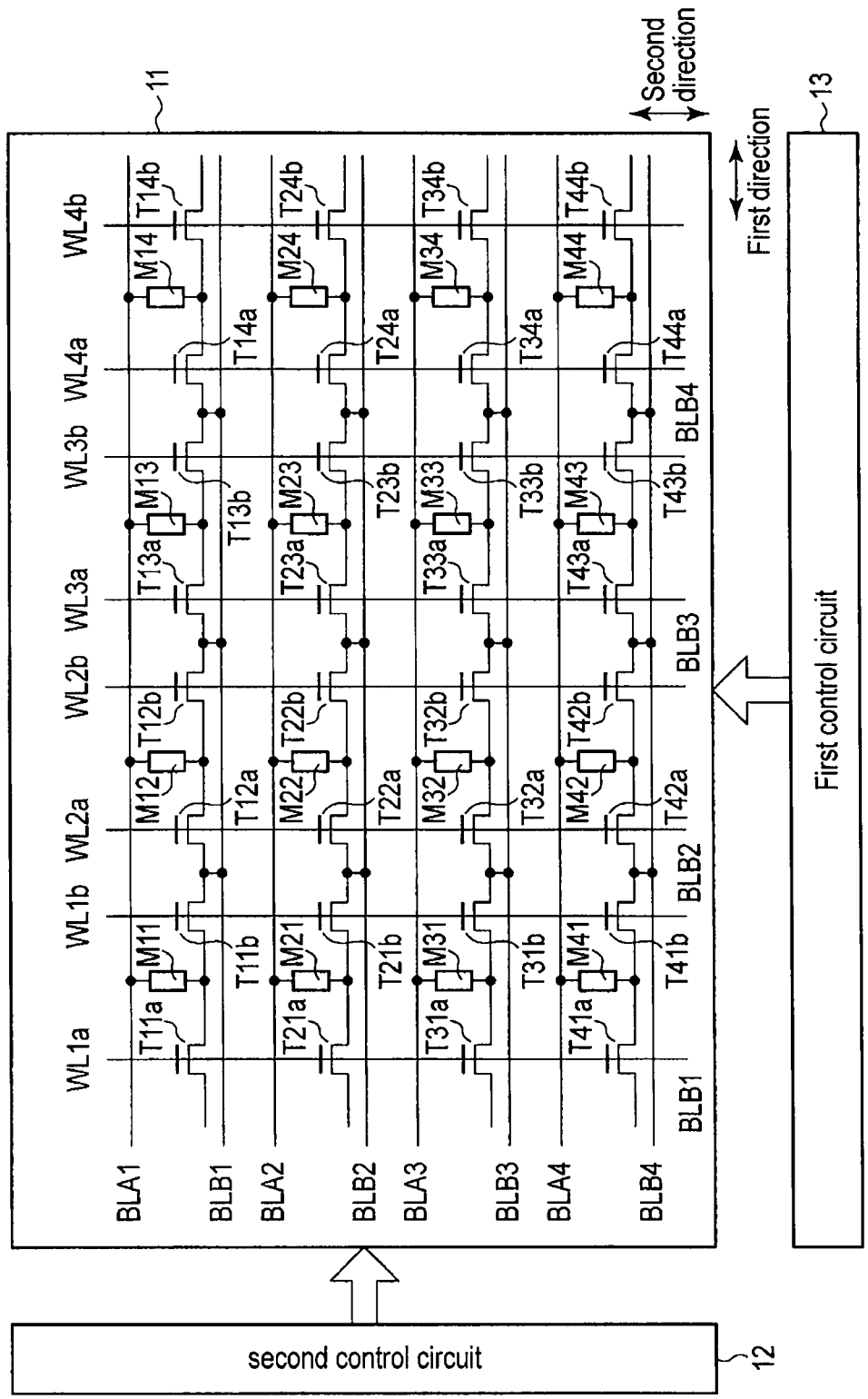
F I G. 26

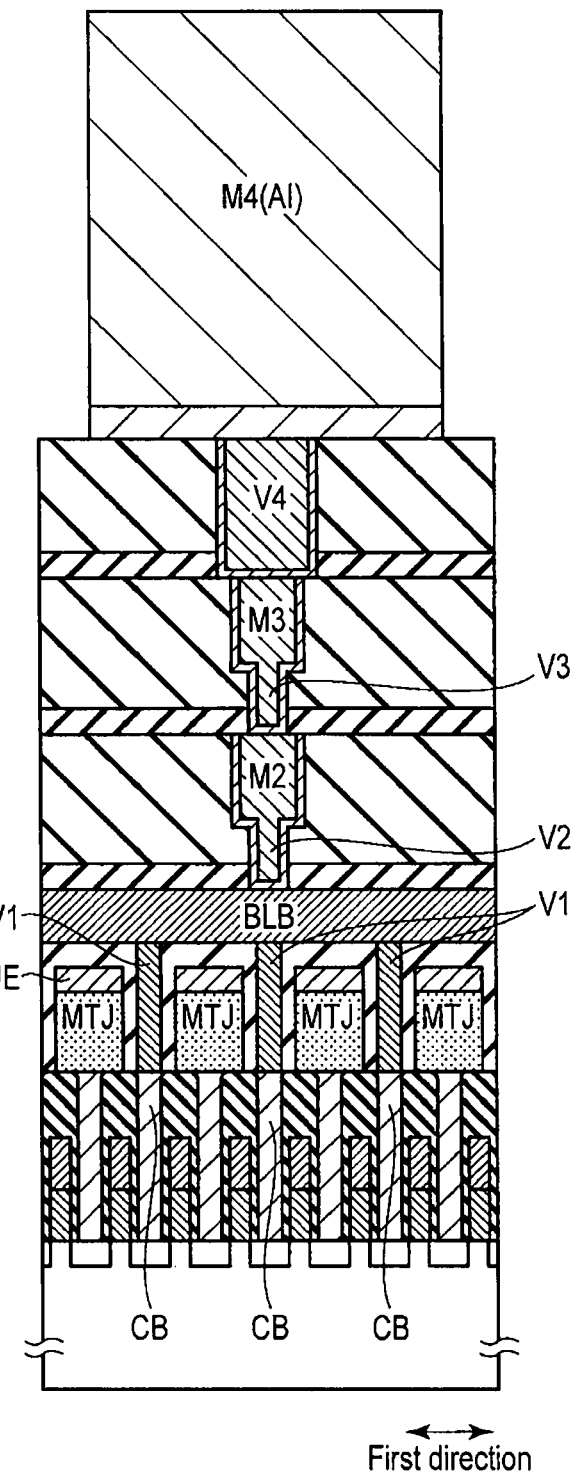
F I G. 27

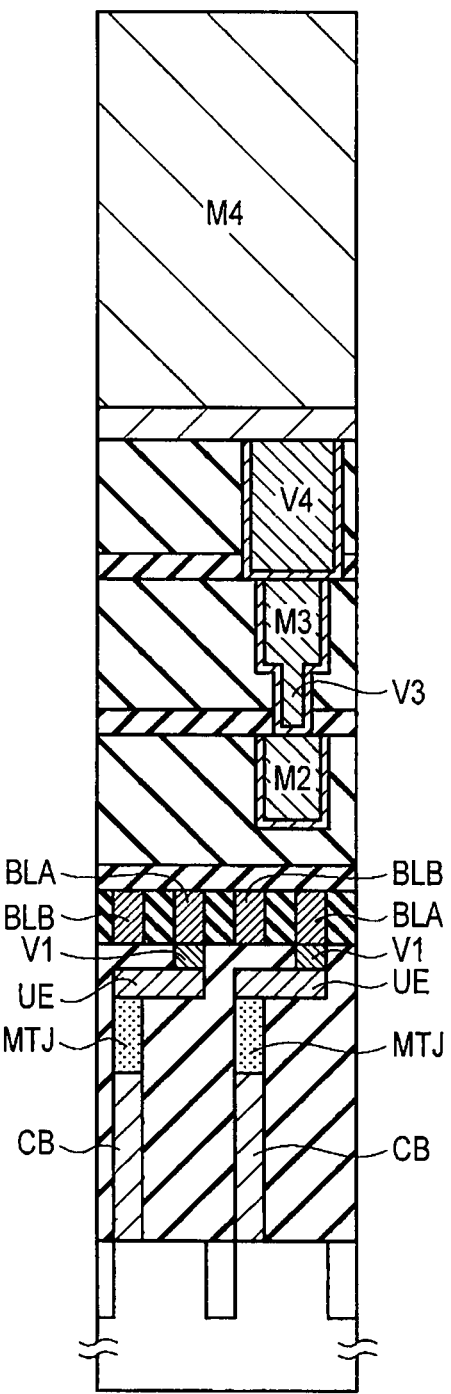
FIG. 28   Second direction

MAGNETORESISTIVE ELEMENT AND METHOD OF MANUFACTURING THE SAME

CROSS-REFERENCE TO RELATED APPLICATIONS

This application is based upon and claims the benefit of priority from prior Japanese Patent Application No. 2011-147464, filed Jul. 1, 2011, the entire contents of which are incorporated herein by reference.

FIELD

Embodiments described herein relate generally to a magnetoresistive element and a method of manufacturing the same.

BACKGROUND

A magnetoresistive element is used in, e.g., a memory cell of a magnetic random access memory, or an LSI such as a spin-transfer-torque switching field-effect transistor (FET) of a reconfigurable logic circuit. In this case, the magnetoresistive element is patterned into a pillar. This patterning of the magnetoresistive element is performed using so-called physical etching because the magnetoresistive element is made of a hard material.

Since, however, physical etching is an etching method that physically scrapes off a material to be etched by colliding atoms against the material, the material is re-deposited on the sidewall of the patterned magnetoresistive element, i.e., a so-called, re-deposition phenomenon occurs. This re-deposition phenomenon causes a shortcircuit between a recording layer and reference layer of the magnetoresistive element.

To prevent this shortcircuit, a process of oxidizing the re-deposition layer formed on the sidewall of the magnetoresistive element during or after patterning of the magnetoresistive element has been developed. If this process is adopted, however, the edges of the recording layer and reference layer of the magnetoresistive element are also unintentionally oxidized. This deteriorates the characteristics (e.g., increases the element resistance) of the magnetoresistive element.

BRIEF DESCRIPTION OF THE DRAWINGS

FIGS. 1 and 2 are views showing basic structures;
FIG. 9 is a view showing the sixth embodiment;
FIG. 10 is a view showing the seventh embodiment;
FIG. 11 is a view showing the eighth embodiment;
FIGS. 12 to 22 are views showing an example of a manufacturing method;
FIG. 26 is a view showing an equivalent circuit of the memory cell array;
FIG. 27 is a view showing the sectional structure in a first direction of the array shown in FIG. 26;
and
FIG. 28 is a view showing the sectional structure in a second direction of the array shown in FIG. 26.

DETAILED DESCRIPTION

Figure 3:
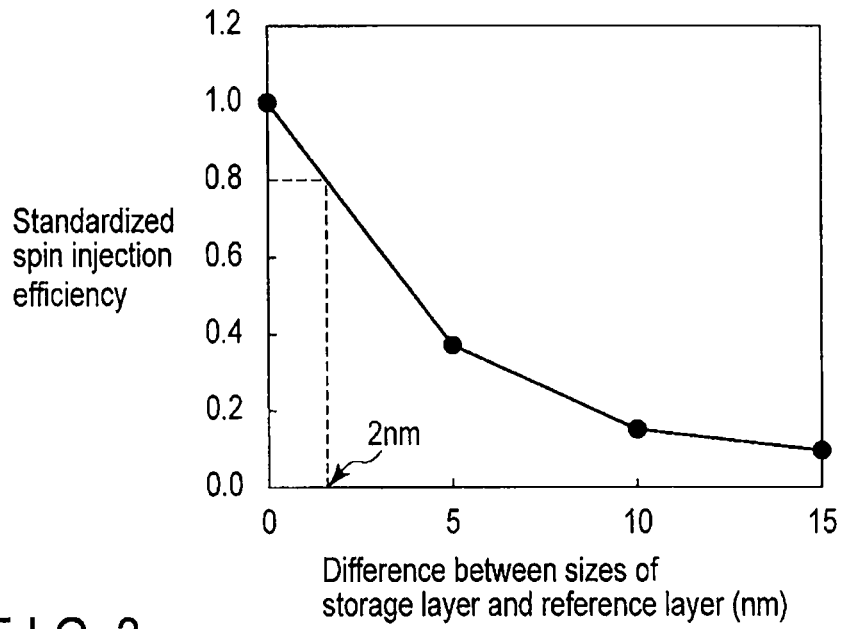
FIG. 3 is a view showing the relationship between the size difference and spin injection efficiency.

In general, according to one embodiment, a magnetoresistive element includes a storage layer having a variable and perpendicular magnetization, a tunnel barrier layer on the storage layer, a reference layer having an invariable and perpendicular magnetization on the tunnel barrier layer, a hard mask layer on the reference layer, and a sidewall spacer layer on sidewalls of the reference layer and the hard mask layer. An in-plane size of the reference layer is smaller than an in-plane size of the storage layer. A difference between the in-plane sizes of the storage layer and the reference layer is 2 nm or less. The sidewall spacer layer includes a material selected from a group of a diamond, DLC, BN, SiC, $B_4C$, $Al_2O_3$ and AlN.

Embodiments will be explained below with reference to the accompanying drawings.

1. Basic Structure

A basic structure for preventing a shortcircuit by the re-deposition phenomenon without deteriorating the characteristics of a magnetoresistive element will be explained below.

FIG. 1 shows the basic structure of the magnetoresistive element.

Tunnel barrier layer 12 is formed on storage layer (magnetic free layer) 11. Reference layer (magnetic pinned layer) 13 is formed on tunnel barrier layer 12. Hard mask layer 14 is formed on reference layer 13.

Storage layer 11 is a magnetic layer having a variable magnetization direction, and reference layer 13 is a magnetic layer having an invariable magnetization direction. This structure is a so-called, top-pin structure.

Storage layer 11 and reference layer 13 have a size difference. That is, the in-plane size (e.g., the diameter when the layer is circular) of reference layer 13 is smaller than that of storage layer 11. This makes it possible to prevent a shortcircuit between storage layer 11 and reference layer 13.

More specifically, reference layer 13 is first patterned by physical etching in this structure. In this state, re-deposition layer 16 is deposited on the sidewall of reference layer 13. After reference layer 13 is patterned, storage layer 11 is patterned by physical etching. In this state, re-deposition layer 15 is deposited on the sidewall of storage layer 11. Since storage layer 11 and reference layer 13 have a size difference, however, re-deposition layers 15 and 16 do not come in contact with each other, and this prevents a shortcircuit between storage layer 11 and reference layer 13 by the re-deposition phenomenon.

Also, since re-deposition layers 15 and 16 do not come in contact with each other, it is unnecessary to oxidize these layers during or after patterning of storage layer 11 and reference layer 13. Accordingly, deterioration of the characteristics (e.g., an increase in element resistance) of the magnetoresistive element can be prevented at the same time.

Note that physical etching can be executed by an ion beam etching (IBE) apparatus or reactive ion etching (RIE) apparatus. Gas cluster ion beam (GCIB) etching is particularly favorable when pattering the magnetoresistive element.

The size difference between storage layer 11 and reference layer 13 is desirably added by sidewall spacer layer 17. This is so because when using sidewall spacer layer 17, storage layer 11 can be patterned by self-alignment without performing any photoengraving process (PEP).

Recently, a so-called spin transfer torque method using a spin-momentum-transfer (SMT) phenomenon is currently most frequently adopted when reversing the magnetization of storage layer 11. This is so because the method can realize the scalability that a magnetization reversal current decreases as the size of a magnetoresistive element decreases, so the method is presumably desirable for a future large capacity.

The spin transfer torque method is particularly effective when storage layer 11 and reference layer 13 have perpendicular magnetization, because the magnetoresistive element can be downsized regardless of its shape.

When storage layer 11 and reference layer 13 have in-plane magnetization, magnetic shape anisotropy must be given to the magnetoresistive element. This is undesirable for downsizing because shape control is restricted. More specifically, a magnetoresistive element having in-plane magnetization must be given an aspect ratio (in-plane aspect ratio) exceeding 1 as a shape. On the other hand, an aspect ratio of 1 is sufficient for a magnetoresistive element having perpendicular magnetization.

"Perpendicular magnetization" herein mentioned means that the direction of residual magnetization is perpendicular or almost perpendicular to the film surfaces (upper surface/lower surface) of storage layer 11 and reference layer 13. In this specification, "almost perpendicular" means that the direction of residual magnetization falls within the range of $45° < \theta \leq 90°$ with respect to the film surfaces of storage layer 11 and reference layer 13.

When storage layer 11 and reference layer 13 have perpendicular magnetization, the size of the magnetoresistive element can be decreased, but a new problem pertaining to the spin injection efficiency arises owing to the thickness of sidewall spacer layer 17 in a lateral direction (the thickness in a direction perpendicular to the sidewall of reference layer 13).

That is, when thickness t of sidewall spacer layer 17 in the lateral direction increases, the size difference between storage layer 11 and reference layer 13 increases, and the spin injection efficiency from reference layer 13 to storage layer 11 decreases owing to this size difference. The decrease in spin injection efficiency has a direct influence on the magnetization reversal efficiency, and hence must be prevented.

When this phenomenon was examined, it was found that if the spin injection efficiency is 80% or more for the size difference of zero between storage layer 11 and reference layer 13, magnetization reversal can be performed without exerting any large influence on the magnetization reversal characteristic.

This value of 80% is based on, e.g., the following grounds.

That is, a current value that can be supplied to a magnetoresistive element can be increased by raising a driving voltage for driving a driver (FET), and a maximum value of the current value that can be increased is about 1.2 times the design value owing to, e.g., the breakdown voltage of the driver. From this viewpoint, even if the spin injection efficiency becomes 0.8 times (80%) the design value when this basic structure is adopted, the decrease in spin injection efficiency can be compensated for by the rise in driving voltage of the driver, by setting the driving voltage to an allowable maximum value and, as described above, making the current value to be supplied to the magnetoresistive element about 1.2 times the design value.

Accordingly, magnetization reversal can be performed without exerting any large influence on the magnetization reversal characteristic, provided that the spin injection efficiency is 80% or more for the size difference of zero between storage layer 11 and reference layer 13.

As shown in FIG. 3, it was also found that the size difference between storage layer 11 and reference layer 13 must be larger than 0 and 2 nm or less, in order to make the spin injection efficiency 80% or more for the size difference of zero. That is, it was found that thickness t of sidewall spacer layer 17 in the lateral direction must be set within the range of $0 < t \leq 1$ nm.

Note that the size difference between storage layer 11 and reference layer 13 is the difference between in-plane sizes on a straight line passing through central point O of these layers, and equal to the double of thickness t of the sidewall spacer layer 17 in the lateral direction. Note also that thickness t of sidewall spacer layer 17 includes the thickness of re-deposition layer 16 in the lateral direction.

Referring to FIG. 3, the spin injection efficiency is 1 when the size difference between storage layer 11 and reference layer 13 is zero.

It was, however, simultaneously found that when thickness t of sidewall spacer layer 17 in the lateral direction is 1 nm or less, sidewall spacer layer 17 made of a general material such as silicon oxide or silicon nitride cannot withstand physical etching and hence cannot achieve a sufficient effect as a mask layer.

As the basic structure, therefore, a material capable of sufficiently functioning as a mask layer for physical etching when patterning storage layer 11 even if the thickness of sidewall spacer layer 17 in the lateral direction is 1 nm or less is also proposed as sidewall spacer layer 17.

Examples of the material are diamond, diamond-like carbon (DLC), BN, SIC, $B_4C$, $Al_2O_3$ (sapphire), $Al_2O_3$ (microcrystal), and AlN.

As shown in Table 1, these materials are harder than storage layer 11 and a lower electrode layer formed below storage layer 11. Also, these materials are insulators.

TABLE 1

|  | Vickers hardness | Mohs hardness |
|---|---|---|
| Diamond | 5000-8000 | 10 |
| DLC | 3000-5000 | — |
| BN | 4500-4700 | — |
| SiC | 2200-2400 | 9 |
| $B_4C$ | — | 9 |
| $Al_2O_3$ (Sapphire) | 2000 | 9 |
| $Al_2O_3$ (Microcrystal) | 1400-1800 | 9 |
| AlN | 1000-1050 | — |
| Storage layer | 100~150 | — |
| Lower electrode | 150~200 | — |

Note that like sidewall spacer layer 17, hard mask layer 14 can contain one of diamond, DLC, BN, SiC, $B_4C$, $Al_2O_3$ (sapphire), $Al_2O_3$ (microcrystal), and AlN. In this case, hard mask layer 14 and sidewall spacer layer 17 can be made of the same material.

The in-plane shape of storage layer 11 and reference layer 13 is not particularly limited. Although the in-plane shape is a circle in the example shown in FIG. 1, it may also be an ellipse as shown in FIG. 2.

In the basic structure of the top-pin-type magnetoresistive element as described above, the size difference is produced between the storage layer and reference layer, thereby preventing a shortcircuit between them without oxidizing the re-deposition layers. Also, to make the spin injection efficiency for the storage layer 80% or more for the size difference of zero between the storage layer and reference layer, the size difference between them is made greater than 0 and 2 nm or less. Furthermore, the sidewall spacer layer is made of a material harder than the storage layer so as to be able to accurately pattern the storage layer even when the size difference is set within the above-mentioned range.

From the foregoing, it is possible to prevent a shortcircuit caused by the re-deposition phenomenon without deteriorating the characteristics of the magnetoresistive element.

2. Embodiments (1) First Embodiment

Figure 4:
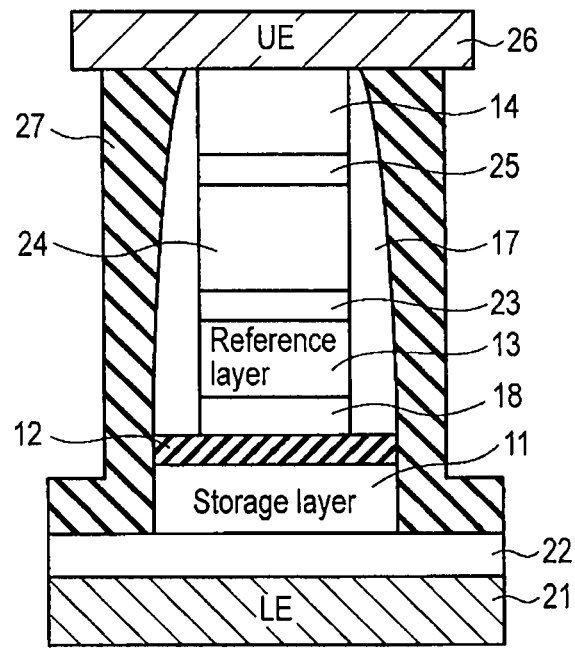
FIG. 4 is a view showing the first embodiment.

FIG. 4 shows the first embodiment of the magnetoresistive element.

This embodiment is directed to a perpendicular magnetization, top-pin-type magnetoresistive element including single-layered sidewall spacer layer 17.

Underlayer (UL) 22 as an underlying layer is formed on lower electrode (LE) 21. Storage layer (magnetic free layer) 11 is formed on underlayer 22. Tunnel barrier layer 12 is formed on storage layer 11. Interface layer 18 is formed on tunnel barrier layer 12.

Reference layer (magnetic pinned layer) 13 is formed on interface layer 18. Nonmagnetic layer 23 is formed on reference layer 13. Shift adjustment layer (magnetic layer) 24 is formed on nonmagnetic layer 23. Nonmagnetic layer 25 is formed on shift adjustment layer 24. Hard mask layer 14 is formed on nonmagnetic layer 25. Upper electrode (UE) 26 is formed on hard mask layer 14.

Storage layer 11 and reference layer 13 have a size difference. That is, the in-plane size of reference layer 13 is smaller than that of storage layer 11. This prevents a shortcircuit between storage layer 11 and reference layer 13.

Sidewall spacer layer 17 is formed on the sidewalls of interface layer 18, reference layer 13, shift adjustment layer 24, nonmagnetic layers 23 and 25, and hard mask layer 14.

Protection layer 27 covers storage layer 11, tunnel barrier layer 12, reference layer 13, interface layer 18, and shift adjustment layer 24, thereby protecting them from oxidation, corrosion by water, and the like.

Storage layer 11 is a magnetic layer having a variable magnetization direction, and reference layer 13 is a magnetic layer having an invariable magnetization direction. Both storage layer 11 and reference layer 13 have perpendicular magnetization by which residual magnetization is perpendicular or almost perpendicular to their film surfaces.

Tunnel barrier layer 12 contains, e.g., MgO.

Shift adjustment layer 24 has a function of adjusting the shift of the magnetic hysteresis curve of storage layer 11, which is caused by the structure of the magnetoresistive element. Shift adjustment layer 24 achieves the function when added to reference layer 13. Shift adjustment layer 24 contains, e.g., Pt, Pd, or Ir.

Sidewall spacer layer 17 and hard mask layer 14 are made of a hard material, and contain, e.g., one of diamond, DLC, BN, SiC, $B_4C$, $Al_2O_3$ (sapphire), $Al_2O_3$ (microcrystal), and AlN.

Protection layer 27 contains, e.g., an insulating nitride (e.g., SiN, AlN, or BN). Protection layer 27 prevents the diffusion of $H_2O$ and $O_2$ from an interlayer dielectric layer to the magnetoresistive element. Protection layer 27 is desirably formed at a temperature of 250° C. or more, in order to prevent a redox reaction in the side surface portion (the end portion in the lateral direction) of tunnel barrier layer 12.

(2) Second Embodiment

Figure 5:
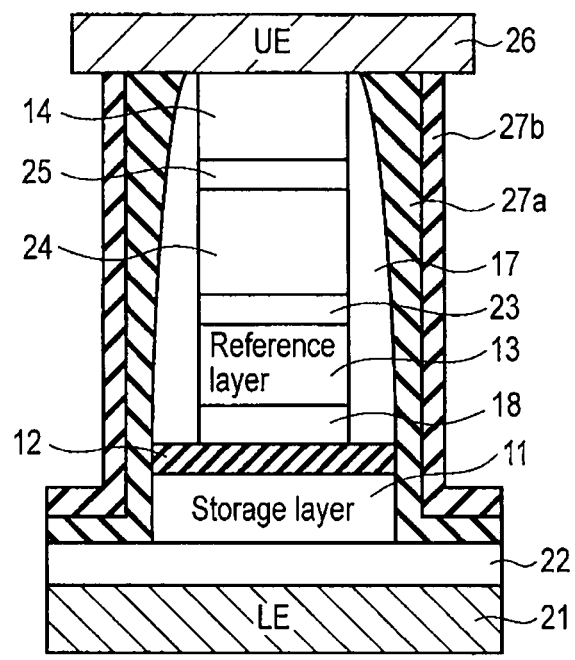
FIG. 5 is a view showing the second embodiment.

FIG. 5 shows the second embodiment of the magnetoresistive element.

This embodiment is a modification of the first embodiment.

The difference of this embodiment from the first embodiment is the structure of protection layers 27a and 27b. Other features are the same as those of the first embodiment, so a repetitive explanation will be omitted.

Protection layer 27a contains, e.g., one of $Al_2O_3$ and MgO. When protection layer 27a is an oxide film or oxynitride film, protection layer 27a is desirably formed at a temperature of 300° C. or less, in order to prevent an oxidation reaction in the side surface portion (the end portion in the lateral direction) of tunnel barrier layer 12.

Also, protection layer 27b contains, e.g., one of SiN, AlN, and BN. When protection layer 27b is a nitride film, protection layer 27b is desirably formed at a temperature of 250 to 350° C., in order to prevent a reduction reaction in the side surface portion of tunnel barrier layer 12.

The formation temperature of protection layers 27a and 27b is particularly effective when MgO is used as tunnel barrier layer 12. This is so because in this case, the etching surface (side surface) of tunnel barrier layer 12 is very unstable and readily oxidized/reduced.

Note that the number of protection layers is two in this embodiment, but the number may also be three or more.

(3) Third Embodiment

Figure 6:
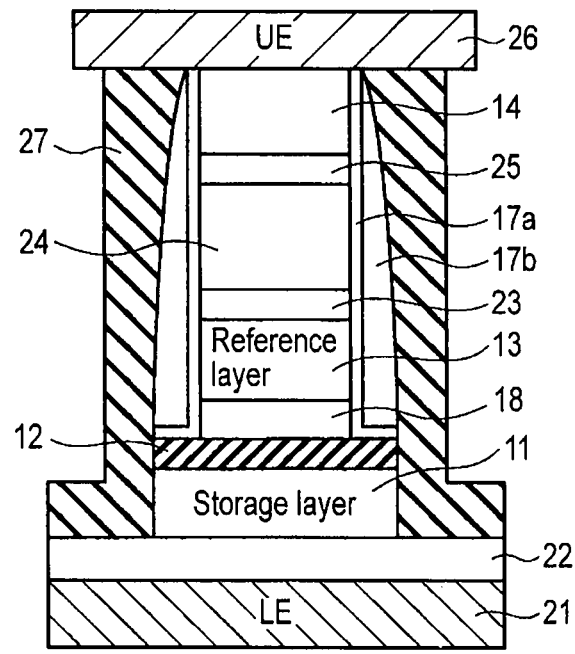
FIG. 6 is a view showing the third embodiment.

FIG. 6 shows the third embodiment of the magnetoresistive element.

This embodiment is also a modification of the first embodiment.

The difference of this embodiment from the first embodiment is the structure of sidewall spacer layers 17a and 17b. Other features are the same as those of the first embodiment, so a repetitive explanation will be omitted.

Sidewall spacer layer 17a can contain an insulating oxide, e.g., one of $Al_2O_3$ and MgO. In this case, sidewall spacer layer 17a is desirably formed at a temperature of 300° C. or less, in order to prevent an oxidation reaction in the side surface portion (the end portion in the lateral direction) of tunnel barrier layer 12.

Also, sidewall spacer layer 17a can also contain an insulating nitride, e.g., one of SiN, An, and BN. In this case, sidewall spacer layer 17a is desirably formed at a temperature of 250 to 350° C., in order to prevent a reduction reaction in the side surface portion of tunnel barrier layer 12.

Sidewall spacer layer 17b contains one of diamond, DLC, BN, SiC, $B_4C$, $Al_2O_3$ (sapphire), $Al_2O_3$ (microcrystal), and AlN.

Note that the number of sidewall spacer layers is two in this embodiment, but the number may also be three or more.

(4) Fourth Embodiment

Figure 7:
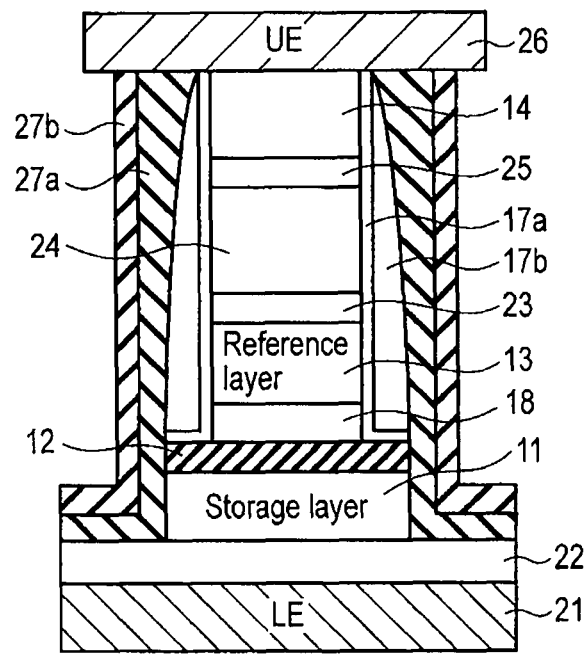
FIG. 7 is a view showing the fourth embodiment.

FIG. 7 shows the fourth embodiment of the magnetoresistive element.

This embodiment is a combination of the second and third embodiments.

Sidewall spacer layer 17a contains, e.g., one of $Al_2O_3$, MgO, SiN, PlN, and BN. Sidewall spacer layer 17b contains one of diamond, DLC, BN, SiC, $B_4C$, $Al_2O_3$ (sapphire), $Al_2O_3$ (microcrystal), and AlN.

Protection layer 27a contains, e.g., one of $Al_2O_3$ and MgO. Protection layer 27b contains, e.g., one of SiN, AlN, and BN.

Note that the number of sidewall spacer layers is two in this embodiment, but the number may also be three or more. Note also that the number of protection layers is two in this embodiment, but the number may also be three or more.

(5) Fifth Embodiment

Figure 8:
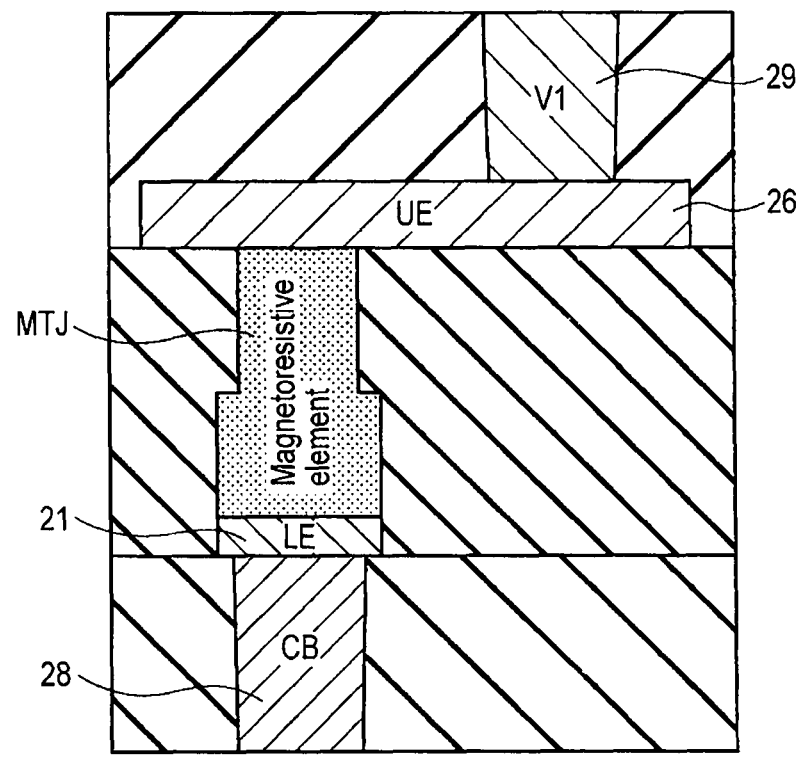
FIG. 8 is a view showing the fifth embodiment.

FIG. 8 shows the fifth embodiment of the magnetoresistive element.

This embodiment is directed to the internal layout of an LSI of the magnetoresistive element.

Magnetoresistive element MTJ has, e.g., the structure shown in the first to fourth embodiments (FIGS. 4, 5, 6, and 7). In this embodiment, the structure of magnetoresistive element MTJ is not particularly restricted, so an explanation thereof will be omitted.

Magnetoresistive element MTJ is formed immediately above contact via (CB) 28 with lower electrode (LE) 21 being sandwiched between them. Upper electrode (UE) 26 is formed on magnetoresistive element MTJ. Via (V1) 29 is formed on upper electrode (UE) 26.

Lower electrode (LE) 21 has a function of reducing unevenness caused by a seam or the like formed on the upper surface of contact via (CB) 28, thereby planarizing the underlying surface of magnetoresistive element MTJ. Roughness Ra of the underlying surface (e.g., the upper surface of lower electrode 21) of magnetoresistive element MTJ is preferably Ra≤0.3 nm.

Upper electrode (UE) 26 reduces the required alignment accuracy between via (V1) 29 and magnetoresistive element MTJ, and also functions as a stopper when patterning via (V1) 29 or a via hole in which via (V1) 29 is to be formed.

Note that lower electrode (LE) 21 can also be omitted in this embodiment. In this case, magnetoresistive element MTJ is directly formed on contact via (CB) 28.

(6) Sixth Embodiment

FIG. 9 shows the sixth embodiment of the magnetoresistive element.

This embodiment is also directed to the internal layout of an LSI of the magnetoresistive element.

Magnetoresistive element MTJ has, e.g., the structure shown in the first to fourth embodiments (FIGS. 4, 5, 6, and 7). The structure of magnetoresistive element MTJ is not particularly restricted, so an explanation thereof will be omitted, in this embodiment as well.

Lower electrode (LE) 21 is formed on contact via (CB) 28. Magnetoresistive element MTJ is formed on lower electrode (LE) 21. Upper electrode (UE) 26 is formed on magnetoresistive element MTJ. Via (V1) 29 is formed on upper electrode (UE) 26. Via (V1) 29 is positioned immediately above magnetoresistive element MTJ.

Lower electrode (LE) 21 reduces the required alignment accuracy between magnetoresistive element MTJ and contact via (CB) 28, and also functions as a stopper when patterning magnetoresistive element MTJ.

Lower electrode (LE) 21 also reduces unevenness caused by a seam or the like formed on the upper surface of contact via (CB) 28. Roughness Ra of the upper surface of lower electrode 21 is preferably Ra 0.3 nm.

Note that upper electrode (UE) 26 can also be omitted in this embodiment. In this case, via (V1) 29 is directly formed on magnetoresistive element MTJ.

(7) Seventh Embodiment

FIG. 10 shows the seventh embodiment of the magnetoresistive element.

This embodiment is a combination of the fifth and sixth embodiments.

Lower electrode (LE) 21 is formed on contact via (CB) 28. Magnetoresistive element MTJ is formed on lower electrode (LE) 21. Upper electrode (UE) 26 is formed on magnetoresistive element MTJ. Via (V1) 29 is formed on upper electrode (UE) 26.

Lower electrode (LE) 21 reduces the required alignment accuracy between magnetoresistive element MTJ and contact via (CB) 28, and also functions as a stopper when patterning magnetoresistive element MTJ.

Lower electrode (LE) 21 also reduces unevenness caused by a seam or the like formed on the upper surface of contact via (CB) 28. Roughness Ra of the upper surface of lower electrode 21 is preferably Ra≤0.3 nm.

Upper electrode (UE) 26 reduces the required alignment accuracy between via (V1) 29 and magnetoresistive element MTJ, and also functions as a stopper when patterning via (V1) 29 or a via hole in which via (V1) 29 is to be formed.

(8) Eighth Embodiment

FIG. 11 shows the eighth embodiment of the magnetoresistive element.

This embodiment is a modification of the seventh embodiment.

This structure is an intermediate plug-type structure, and has a feature that lower electrode (LE) 21 and upper electrode (UE) 26 are simultaneously patterned. Therefore, lower electrode (LE) 21 and upper electrode (UE) 26 have the same shape.

Also, a protection layer 30 covering lower electrode (LE) 21, upper electrode (UE) 26, and magnetoresistive element MTJ is formed.

Protection layer 30 contains, e.g., one of SiN, AlN, and BN. Protection layer 30 is desirably formed at a temperature of 250° C. or more, in order to prevent a redox reaction in the side surface portion of a tunnel barrier layer (MgO) of magnetoresistive element MTJ.

This structure can reduce the photoengraving process (PEP) because lower electrode (LE) 21 and upper electrode (UE) 26 are simultaneously patterned.

3. Manufacturing Method

A method of manufacturing the magnetoresistive element according to the above-described embodiments will be explained below.

First, as shown in FIG. 12, underlayer 22, storage layer 11, tunnel barrier layer 12, interface layer (e.g., CoFeB or CoFe) 18, reference layer 13, and hard mask layer 14 are sequentially formed on lower electrode 21.

Storage layer 11 is a single CoFeB layer or a stacked film including CoFeB layers.

Reference layer 13 is a magnetic layer having perpendicular magnetization, e.g., $(Co/Pt)_n$, CoPt, or FePt. Tunnel barrier layer 12 is, e.g., MgO. Practical combinations of reference layer 13 and interface layer 18 are, e.g., $(Co/Pt)_n$/CoFeB, FePt/CoFeB, and CoPt/CoFeB. $(Co/Pt)_n$ means a structure in which a Co layer and Pt layer are alternately stacked once or more.

Each of reference layer 13 and interface layer 18 has a thickness of, e.g., 3 nm or less, and is made of a magnetic alloy containing 50 at % or more of Co, Fe, or Ni.

A shift adjustment layer may be added to reference layer 13 with an interlayer being sandwiched between them. This layer is called a reference layer with shift adjustment layer. The arrangement of the reference layer with shift adjustment layer is, e.g., $(Co/Pt)_n$ (a shift adjustment layer)/Ru (an interlayer)/$(Co/Pt)_n$ (a reference layer)/CoFeB (an interface layer).

Reference layer 13 and interface layer 18 can also be replaced with a reference layer including a shift adjustment layer/interlayer/interface layer. In this case, the reference layer is $(Co/Pt)_n$/Ru/CoFeB.

Furthermore, the shift of the magnetic hysteresis curve of storage layer 11 can be adjusted without any shift adjustment layer. For example, the apparent saturation magnetization (net-Ms) of reference layer 13 can be set to zero by adjusting the composition ratio of Tb to CoFe by using TbCoFe/CoFeB. A composition region in which the saturation magnetization of TbCoFe/CoFeB is zero can be formed by setting the ratio of Tb at 60 to 90 at % on a Tb composition rich side in TbCoFe.

Then, a resist pattern is formed on hard mask layer 14 by PEP, and used as a mask to pattern hard mask layer 14 by using physical etching such as ion beam etching or RIE. After that, the resist pattern is removed.

Hard mask layer 14 contains, e.g., one of diamond, DLC, BN, SiC, $B_4C$, $Al_2O_3$ (sapphire), $Al_2O_3$ (microcrystal), and AlN.

Subsequently, as shown in FIG. 13, hard mask layer 14 is used as a mask to pattern reference layer 13 and interface layer 18 by physical etching such as ion beam etching (e.g., GCIB etching). Hard mask layer 14 is used as a mask in this process because if a photoresist is used as a mask, reference layer 13 and interface layer 18 may oxidize when the photoresist is removed by ashing.

Also, re-deposition layers are formed on the sidewalls of reference layer 13 and interface layer 18 by this ion beam etching. As already described, however, this does not cause any shortcircuit between storage layer 11 and reference layer 13. This obviates the need for a process of oxidizing the re-deposition layers. Note that FIG. 13 shows no re-deposition layers.

Furthermore, this ion beam etching is desirable in order to reduce damage to the etching surfaces (side surfaces) of reference layer 13 and interface layer 18.

When using Ar ions, for example, the penetration depth of Ar ions in the lateral direction with respect to reference layer 13 and interface layer 18 (the penetration depth from the side surface of hard mask layer 14 in a direction perpendicular to the side surface) is about 1 nm at an ion acceleration voltage of about 200 eV. Accordingly, physical damage, magnetic damage, and crystalline damage to reference layer 13 and interface layer 18 are negligibly small.

Note that the ion acceleration voltage of ion beam etching is preferably 200 eV or less. Note also that the etching of reference layer 13 and interface layer 18 must be stopped at the upper surface of tunnel barrier layer 12 (MgO barrier stopping). The ion acceleration voltage of ion beam etching is more preferably 100 eV or less, in order to facilitate MgO barrier stopping by increasing the etching selectivity between the magnetic layers (reference layer 13 and interface layer 18) and tunnel barrier layer 12, and to reduce physical damage to storage layer 11.

Reference layer 13 and interface layer 18 may also be patterned by RIE using a gas such as He, $H_2$, Ne, Ar, Xe, Kr, $N_2$, CO, $CO_2$, or $CH_3OH$, instead of ion beam etching.

The following technique is also applicable to more reliably perform MgO barrier stopping.

In the initial stages of the patterning of reference layer 13, the etching of reference layer 13 progresses at a relatively high etching rate. Therefore, at a timing at which etching has reached interface layer 18 or at a timing slightly later than that, the mode is switched to an etching mode in which interface layer 18 is etched at a relatively low etching rate.

This etching mode is more desirably performed under conditions that increase the etching selectivity between interface layer 18 and tunnel barrier layer 12.

The progress of ion beam etching can be detected by SIMS, and that of RIE can be detected by OES.

The energy of an ion beam when etching interface layer 18 is determined by the relationship between the threshold values of sputtering of tunnel barrier layer 12 and interface layer 18 performed by the ion beam. The sputtering threshold value herein mentioned is an ion acceleration voltage at which sputtering (etching) is started.

The sputtering threshold value is about 80 eV when tunnel barrier layer 12 is MgO, and about 20 eV when interface layer 18 contains a material (e.g., CoFeB) containing metals such as Co, Fe, and Ni. As described above, therefore, the ion acceleration voltage is preferably 100 eV or less, and more preferably in the range of 20 to 80 eV.

When adopting the above-mentioned technique, the etching selectivity between interface layer 18 and tunnel barrier layer 12 can be set at 5 or more, and can also be set at 10 or more. This makes it possible to reliably perform MgO barrier stopping.

Note that when etching is performed at an ion acceleration voltage of 100 eV or more by using the same material as described above, the etching selectivity between interface layer 18 and tunnel barrier layer 12 is 1 to 3.

Then, as shown in FIG. 14, hard material layer 17' covering reference layer 13, hard mask layer 14, and interface layer 18 is formed. Like hard mask layer 14, hard material layer 17' contains, e.g., one of diamond, DLC, BN, SiC, $B_4C$, $Al_2O_3$ (sapphire), $Al_2O_3$ (microcrystal), and AlN.

Hard material layer 17' is formed by, e.g., thermal ALD, plasma ALD, plasma CVD, IBD, or sputtering. Also, when forming hard material layer 17', it is important that the coverage for the sidewalls of reference layer 13, hard mask layer 14, and interface layer 18 is high. Among other methods, therefore, hard material layer 17' is desirably formed by thermal ALD or plasma ALD by which the coverage (sidewall portion/field portion) is 90% or more and no voids are formed in the edge portion of a pattern.

After that, hard mask layer 17' is etched by physical etching, e.g., ion beam etching, thereby forming sidewall spacer layer 17 on the sidewalls of reference layer 13, hard mask layer 14, and interface layer 18, as shown in FIG. 15.

Note that the process from MgO barrier stopping shown in FIG. 13 to the formation of sidewall spacer layer 17 shown in FIG. 15 is desirably continuously performed in a vacuum.

Figure 16:
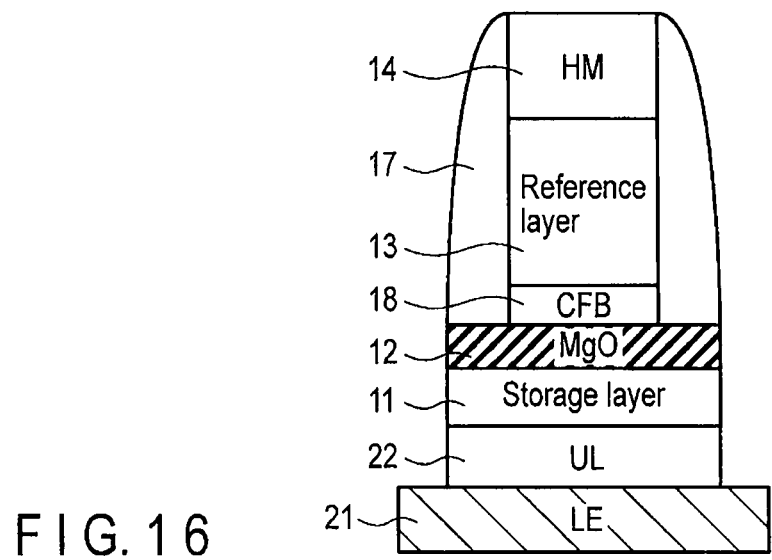

Subsequently, as shown in FIG. 16, hard mask layer 14 and sidewall spacer layer 17 are used as masks to pattern tunnel barrier layer 12, storage layer 11, and underlayer 22 by physical etching, e.g., ion beam etching (e.g., GCIB etching).

This ion beam etching forms a re-deposition layer on the sidewalls of storage layer 11 and underlayer 22. As already described, however, this does not cause any shortcircuit between storage layer 11 and reference layer 13. This makes a process of oxidizing the re-deposition layer unnecessary. Note that FIG. 16 shows no re-deposition layer.

Furthermore, this ion beam etching is desirable in order to reduce damage to the etching surfaces (side surfaces) of storage layer 11 and underlayer 22.

Note that the ion acceleration voltage of ion beam etching is desirably 200 eV or less. Note also that the etching of storage layer 11 and underlayer 22 must be stopped at the upper surface of lower electrode 21. Therefore, it is also possible to adopt the technique used when etching reference layer 13 and interface layer 18, i.e., the technique of switching the etching modes during etching.

The magnetoresistive element is formed by the above-described process.

Figure 17:
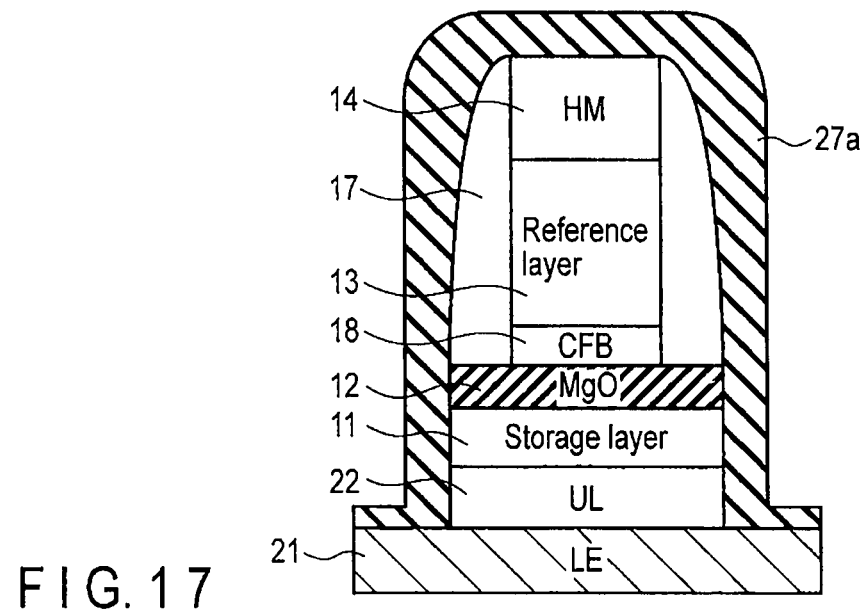

After that, a protection layer 27a covering the magnetoresistive element is formed as shown in, e.g., FIG. 17. Protection layer 27a is desirably formed in a vacuum in order to prevent the oxidation of the magnetoresistive element.

Protection layer 27a is formed by, e.g., thermal ALD, plasma ALD, plasma CVD, IBD, or sputtering. Among other methods, protection layer 27a is desirably formed by thermal ALD or plasma ALD by which the coverage (sidewall portion/field portion) is 90% and no voids are formed in the edge portion of a pattern.

Protection layer 27a contains, e.g., one of $Al_2O_3$ and MgO, in order to stabilize the side surface portion (the end portion in the lateral direction) of tunnel barrier layer 12. Protection layer 27a is desirably formed at a temperature of 300° C. or less, in order to prevent a redox reaction in the side surface portion of tunnel barrier layer 12.

Figure 18:
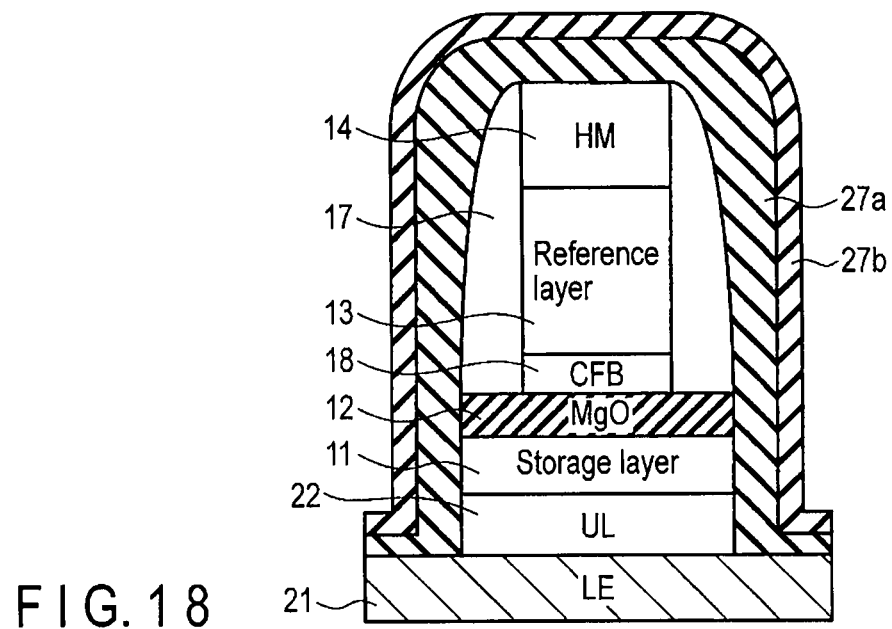

In addition, protection layer 27b is formed on protection layer 27a as shown in, e.g., FIG. 18. Protection layer 27b contains, e.g., one of SiN, AlN, and BN, in order to prevent the diffusion of $H_2O$ and $O_2$ from an interlayer dielectric layer to the magnetoresistive element.

Protection layer 27b is formed by, e.g., thermal ALD, plasma ALD, plasma CVD, IBD, or sputtering. Among other methods, protection layer 27b is desirably formed by thermal ALD or plasma ALD by which the coverage (sidewall portion/field portion) is 90% and no voids are formed in the edge portion of a pattern.

FIGS. 19, 20, 21, and 22 depict a modification of the above-described manufacturing method.

This modification is directed to a process when the sidewall spacer layer includes two layers.

Figure 19:
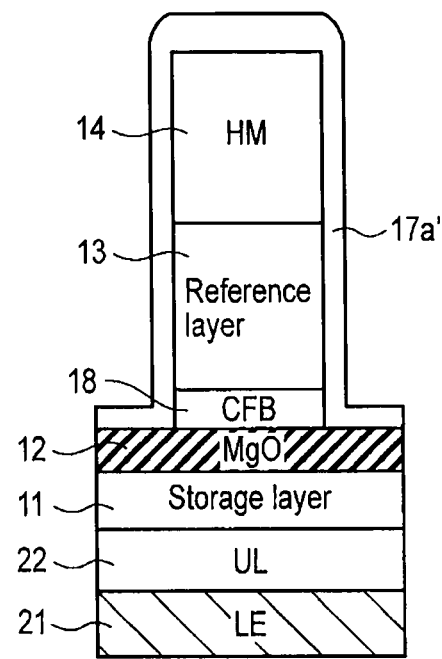

First, as shown in FIG. 19, the steps until reference layer 13 and interface layer 18 are patterned by using hard mask layer 14 as a mask are executed by the above-described manufacturing method.

After that, insulating layer 17a' covering reference layer 13, hard mask layer 14, and interface layer 18 is formed. Insulating layer 17a' is formed by, e.g., thermal ALD, plasma ALD, plasma CVD, IBD, or sputtering. Among other methods, insulating layer 17a' is desirably formed by thermal ALD or plasma ALD by which the coverage (sidewall portion/field portion) is 90% and no voids are formed in the edge portion of a pattern.

Insulating layer 17a' is formed by, e.g., $Al_2O_3$ or MgO. In this case, insulating layer 17a' is desirably formed at a temperature of 300° C. or less, in order to prevent an oxidation reaction in the side surface portion (the end portion in the lateral direction) of tunnel barrier layer 12.

Also, insulating layer 17a' is formed by, e.g., SiN, AlN, or BN. In this case, insulating layer 17a' is desirably formed at a temperature of 250° C. or more, in order to prevent an reduction reaction in the side surface portion of tunnel barrier layer 12.

Figure 20:
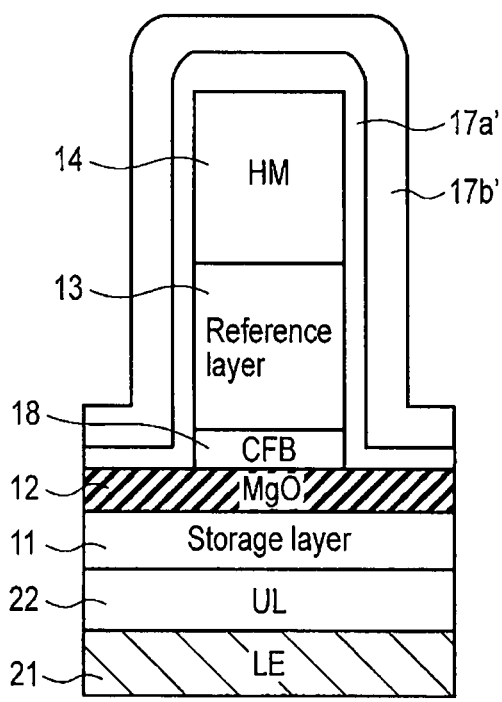

Subsequently, as shown in FIG. 20, hard material layer 17b' is formed on insulating layer 17a'. Hard material layer 17b' is formed by, e.g., diamond, DLC, BN, SiC, $B_4C$, $Al_2O_3$ (sapphire), $Al_2O_3$ (microcrystal), or AlN.

Also, hard material layer 17b' is formed by, e.g., thermal ALD, plasma ALD, plasma CVD, IBD, or sputtering. Among other methods, hard material layer 17b' is desirably formed by thermal ALD or plasma ALD by which the coverage (sidewall portion/field portion) is 90% or more and no voids are formed in the edge portion of a pattern.

Figure 21:
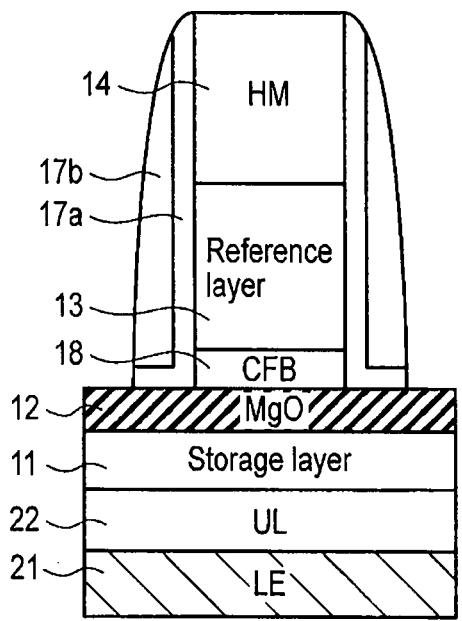

After that, insulating layer 17a' and hard material layer 17b' are etched by physical etching, e.g., ion beam etching, thereby forming sidewall spacer layers 17a and 17b on the sidewalls of reference layer 13, hard mask layer 14, and interface layer 18, as shown in FIG. 21.

Note that the process from MgO barrier stopping to the formation of sidewall spacer layers 17a and 17b is desirably continuously performed in a vacuum in this modification as well.

Figure 22:
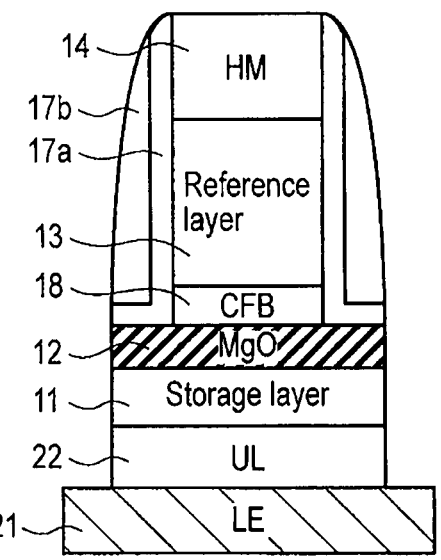

Then, as shown in FIG. 22, hard mask layer 14 and sidewall spacer layers 17a and 17b are used as masks to pattern tunnel barrier layer 12, storage layer 11, and underlayer 22 by physical etching, e.g., ion beam etching (e.g., GCIB etching).

The magnetoresistive element is formed by the above-mentioned process.

After that, protection layers 27a and 27b covering the magnetoresistive element are formed in the same manner as in the above-described manufacturing method (FIGS. 17 and 18).

4. Application Example

The magnetoresistive element according to the above-described embodiments is applicable to a magnetic random access memory or spin-transfer-torque switching FET. The magnetic random access memory will be explained below.

Figure 23:
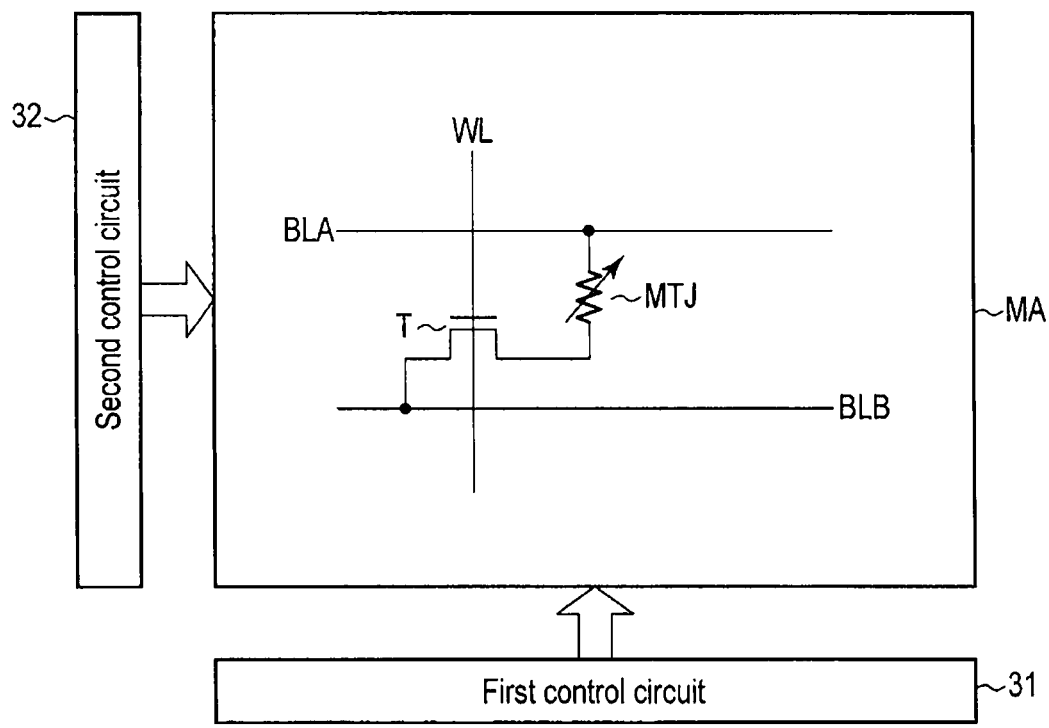
FIG. 23 is a view showing an equivalent circuit of a memory cell.

FIG. 23 shows an equivalent circuit of a memory cell of the magnetic random access memory.

Memory cell MC in memory cell array MA has a series circuit including magnetoresistive element MTJ and switching element (e.g., FET) T. One terminal of the series circuit (one terminal of magnetoresistive element MTJ) is connected to bit line BLA, and the other terminal of the series circuit (one terminal of switching element T) is connected to bit line BLB. A control terminal of switching element T, e.g., the gate electrode of the FET is connected to word line WL.

First control circuit 31 controls the potential of word line WL. Second control circuit 32 controls the potentials of bit lines BLA and BLB.

Figure 24:
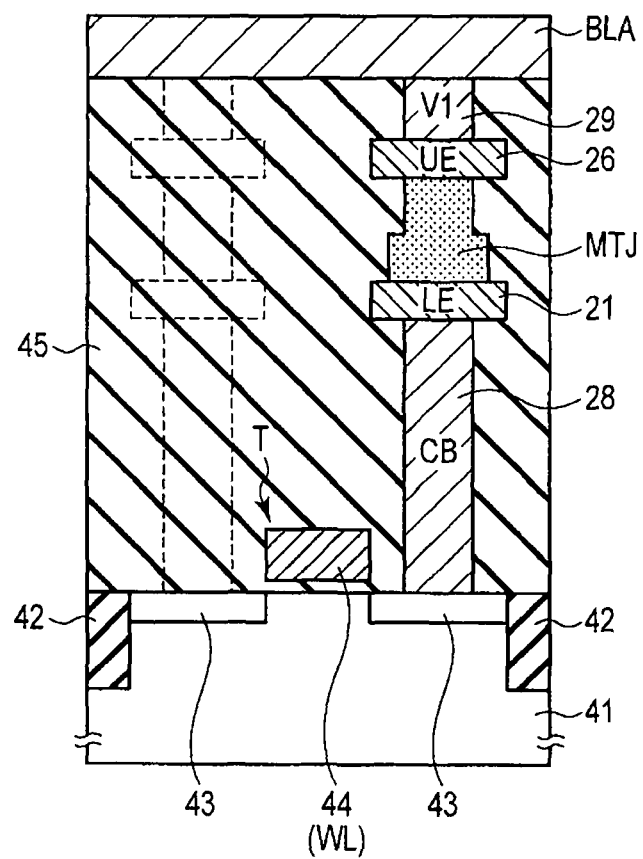
FIG. 24 is a view showing an example of the structure of the memory cell.

FIG. 24 shows the structure of the memory cell of the magnetic random access memory.

Semiconductor substrate 41 is, e.g., a silicon substrate, and the conductivity type of the substrate can be either a p- or an n-type. Silicon oxide layers having an STI structure are formed as element isolation insulating layers 42 in semiconductor substrate 41.

Switching element T is formed in a surface region of semiconductor substrate 41, more specifically, in an element region (active area) surrounded by element isolation insulating layer 42. In this embodiment, switching element T is an FET, and includes two source/drain diffusion layers 43 formed in semiconductor substrate 41, and gate electrode 44 formed on a channel region between the diffusion layers. Gate electrode 44 functions as word line WL.

Switching element T is covered with insulating layer (e.g., silicon oxide) 45. A contact hole is formed in insulating layer 45, and contact via (CB) 28 is formed in the contact hole. Contact via 28 is made of a metal material such as W (tungsten) or Cu (copper).

The lower surface of contact via 28 is connected to the switching element. In this embodiment, contact via 28 is in direct contact with source/drain diffusion layer 43.

Lower electrode 21 is formed on contact via 28. Lower electrode 21 has, e.g., a stacked structure including Ta (10 nm)/Ru (5 nm)/Ta (5 nm).

Magnetoresistive element MTJ is formed on lower electrode 21, i.e., immediately above contact via 28. Upper electrode (e.g., TiN) 26 is formed on magnetoresistive element MTJ. Upper electrode 26 is connected to bit line (e.g., Cu) BLA through via (e.g., Cu) 29.

Figure 25:
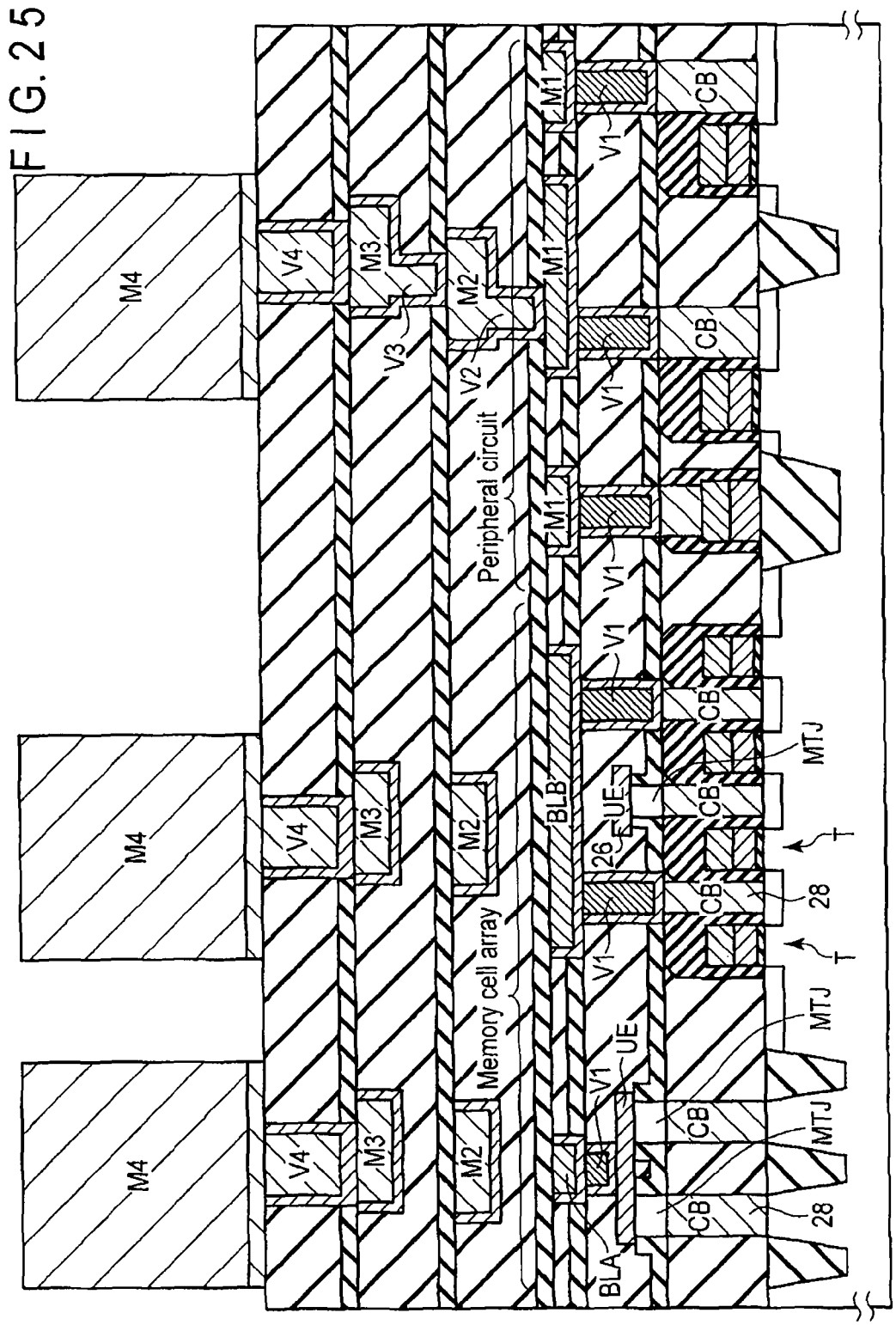
FIG. 25 is a view showing an example of the structure of a memory cell array.

FIG. 25 shows details of the magnetic random access memory.

In the memory cell array, magnetoresistive element MTJ is formed between contact via (CB) 28 and upper electrode (UE) 26. Switching element T is an FET. Magnetoresistive element MTJ is not formed in a peripheral circuit.

In this embodiment, metal interconnection layers M1 to M4 are four layers, and connected to each other by vias V1 to V4. Bit lines BLA and BLB are formed in metal interconnection layer M1.

FIG. 26 shows an equivalent circuit of the memory cell array.

This memory cell array has a feature that the maximum current that can be supplied to magnetoresistive element MTJ can be increased by adding two switching elements (cell transistors) to one magnetoresistive element.

Referring to FIG. 26, a blackened region is equivalent to one memory cell MC.

For example, two switching elements T11a and T11b are added to magnetoresistive element M11. Also, two switching elements T12a and T12b are added to magnetoresistive element M12. Furthermore, two switching elements T13a and T13b are added to magnetoresistive element M13.

FIG. 27 shows the sectional structure in a first direction of memory cell array MA shown in FIG. 26. FIG. 28 shows the sectional structure in a second direction of memory cell array MA shown in FIG. 26.

In this embodiment, metal interconnection layers M1 to M4 are four layers, and are connected to each other by vias V1 to V4, in the same manner as in FIG. 25. Bit lines BLA and BLB are formed in metal interconnection layer M1. A so-called damascene structure is adopted for the interconnection layers of this embodiment.

For example, metal interconnection layers M1 to M3 and vias V1 to V4 have a damascene structure including a barrier metal layer (e.g., TiN/Ti) and a Cu layer. Note that metal interconnection layer M4 as the uppermost layer has no damascene structure.

5. Conclusion

Each embodiment can prevent a shortcircuit caused by the re-deposition phenomenon without deteriorating the characteristics of a magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a storage layer having a variable and perpendicular magnetization;
a tunnel barrier layer on the storage layer;
a reference layer having an invariable and perpendicular magnetization on the tunnel barrier layer;
a hard mask layer on the reference layer;
a side wall spacer layer on side walls of the reference layer and the hard mask layer; and
a boundary layer between the tunnel barrier layer and the reference layer,
wherein an in-plane size of the reference layer is smaller than an in-plane size of the storage layer, a difference between the in-plane sizes of the storage layer and the reference layer is 2 nm or less, and the side wall spacer layer comprises a material selected from a group consisting of a diamond, DLC, BN, SiC, $B_4C$, $Al_2O_3$ and AlN.

2. The element of claim 1,
wherein the side wall spacer layer includes a stacked structure comprising layers, and an uppermost layer of the stacked structure comprises the material.

3. The element of claim 1,
wherein an in-plane size of the side wall spacer layer is 1 nm or less.

4. The element of claim 1,
wherein the side wall spacer layer includes a re-deposition layer which is formed by patterning of the reference layer.

5. The element of claim 1,
wherein the hard mask layer comprises a material selected from a group consisting of a diamond, DLC, BN, SiC, $B_4C$, $Al_2O_3$ and AlN.

6. The element of claim 1,
wherein the side wall spacer layer and the hard mask layer comprises the same material.

7. The element of claim 1,
wherein an in-plane shape of the reference layer is a circular shape.

8. The element of claim 1,
wherein an in-plane shape of the reference layer is an elliptical shape.

9. The element of claim 1,
wherein the tunnel barrier layer comprises MgO.

10. The element of claim 1, further comprising:
a shift adjustment layer between the reference layer and the hard mask layer, the shift adjustment layer which adjusts a shift of a magnetic hysteresis curve of the storage layer.

11. The element of claim 10,
wherein the shift adjustment layer comprises a material selected from a group consisting of Pt, Pd and Ir.

12. The element of claim 1, further comprising:
a protection layer covering the reference layer and the storage layer, the protection layer which protects the reference layer and the storage layer from $H_2O$ and $O_2$.

13. The element of claim 12,
wherein the protection layer comprises a material selected from a group consisting of SiN, AlN and BN.

14. The element of claim 1,
wherein a magnetization of the storage layer is reversed by a spin-momentum-transfer.

15. A magnetic random access memory comprising:
the element of claim 1;
FET having first and second switch terminals and a control terminal, the first switch terminal connected to one of the storage layer and the reference layer of the element;
a word line connected to the control terminal of the FET;
a first bit line connected to the other one of the storage layer and the reference layer of the element;
a second bit line connected to the second switch terminal of the FET;
a first control circuit controlling a potential of the word line; and
a second control circuit controlling potentials of the first and second bit lines.

16. A magnetoresistive element comprising:
a storage layer having a variable and perpendicular magnetization;
a tunnel barrier layer on the storage layer;
a reference layer having an invariable and perpendicular magnetization on the tunnel barrier layer;
a hard mask layer on the reference layer, the hard mask layer comprises a material selected from a group consisting of a diamond, DLC, BN, SiC, $B_4C$, $Al_2O_3$ and AlN; and
a side wall spacer layer on side walls of the reference layer and the hard mask layer,
wherein an in-plane size of the reference layer is smaller than an in-plane size of the storage layer, a difference between the in-plane sizes of the storage layer and the reference layer is 2 nm or less, and the side wall spacer layer comprises a material selected from a group consisting of a diamond, DLC, BN, SiC, $B_4C$, $Al_2O_3$ and AlN.

17. The element of claim 16,
wherein the side wall spacer layer includes a stacked structure comprising layers, and an uppermost layer of the stacked structure comprises the material.

18. The element of claim 16,
wherein an in-plane size of the side wall spacer layer is 1 nm or less.

19. The element of claim 16,
wherein the side wall spacer layer includes a re-deposition layer which is formed by patterning of the reference layer.

20. A magnetic random access memory comprising:
the element of claim 16;
FET having first and second switch terminals and a control terminal, the first switch terminal connected to one of the storage layer and the reference layer of the element;
a word line connected to the control terminal of the FET;
a first bit line connected to the other one of the storage layer and the reference layer of the element;
a second bit line connected to the second switch terminal of the FET;
a first control circuit controlling a potential of the word line; and
a second control circuit controlling potentials of the first and second bit lines.

* * * * *